(12) United States Patent
MacIntyre

(10) Patent No.: US 6,838,894 B2
(45) Date of Patent: Jan. 4, 2005

(54) STRESS RELIEVED CONTACT ARRAY

(76) Inventor: Donald M. MacIntyre, 6535 Timberview Dr., San Jose, CA (US) 95120

( * ) Notice: Subject to any disclaimer, the term of this patent is extended or adjusted under 35 U.S.C. 154(b) by 83 days.

(21) Appl. No.: 10/233,727

(22) Filed: Sep. 3, 2002

(65) Prior Publication Data
US 2004/0041576 A1 Mar. 4, 2004

(51) Int. Cl.⁷ .............................................. G01R 31/02
(52) U.S. Cl. ....................................... 324/755; 324/754
(58) Field of Search ................................ 324/754, 755, 324/757, 758, 765; 439/65, 66, 91

(56) References Cited
U.S. PATENT DOCUMENTS
4,998,885 A * 3/1991 Beaman ....................... 439/66
5,785,538 A * 7/1998 Beaman et al. ............... 439/91

\* cited by examiner

Primary Examiner—David Zarneke
Assistant Examiner—Russell M. Kobert
(74) Attorney, Agent, or Firm—Henry M. Stanley

(57) ABSTRACT

A large array probe/contact having spring characteristics for relieving stress in the contact caused, for example, by temperature change is fabricated using a unique combination of semiconductor fabrication operations. The contacts in the array have a "U" shaped resilient portion, are fixed at one end to a substrate and have an accessible low electrical noise contact tip. The contacts are encapsulated on the substrate in an elastomer to provide additional stress relief resilience, support and protection from damage during handling.

10 Claims, 3 Drawing Sheets

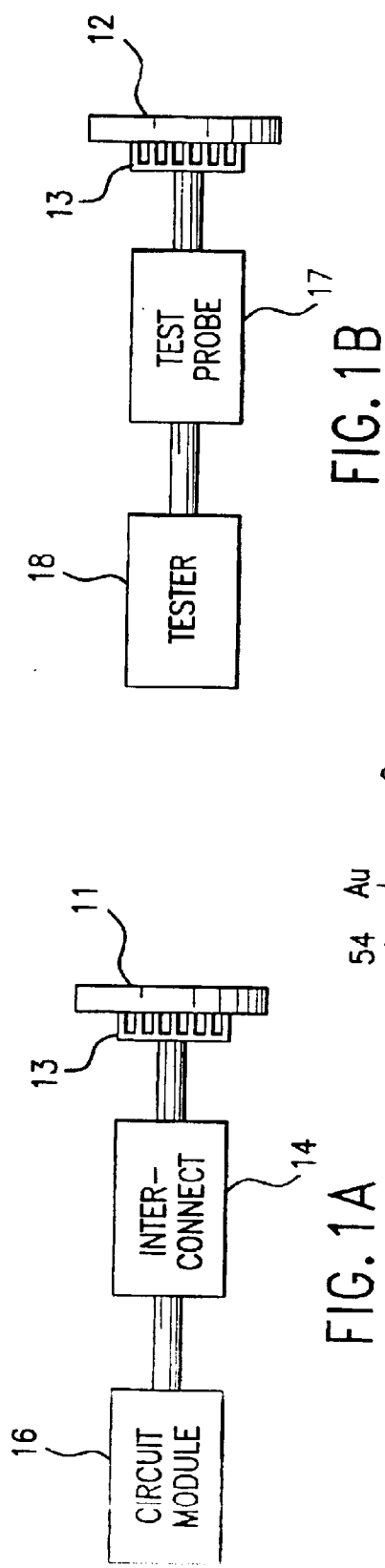
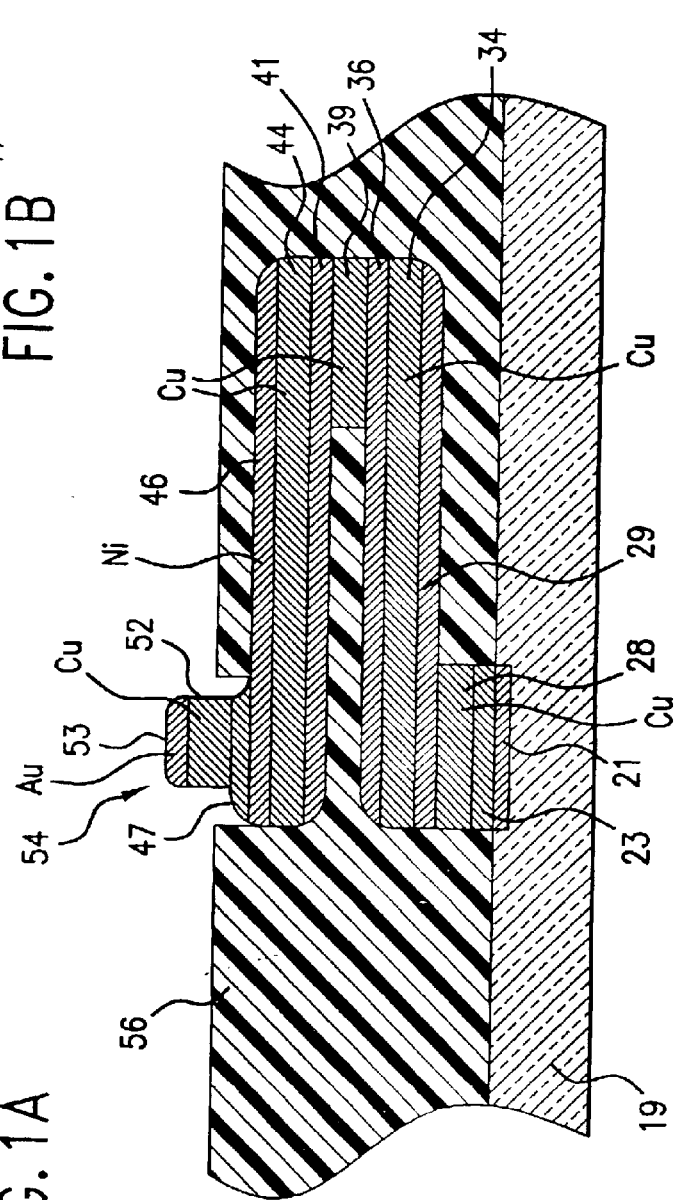

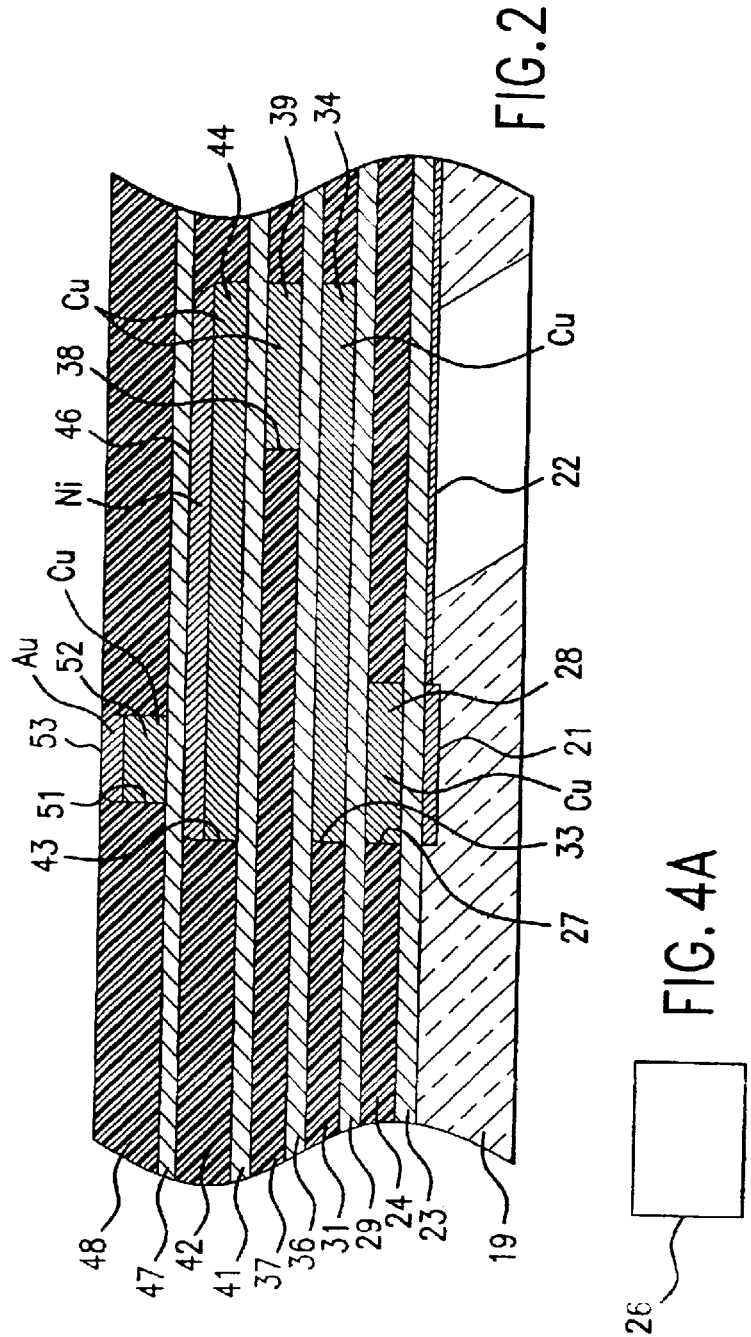

STRESS RELIEVED CONTACT ARRAY

SUMMARY OF THE INVENTION

A large array test probe is used for contacting a plurality of semiconductor devices on a semiconductor wafer. The array includes a substrate having a substrate surface and a plurality of signal pads that are accessible on the substrate surface. A plurality of signal traces is formed on the substrate, wherein the signal traces are in communication with ones of the plurality of signal pads. A first conductive build-up is formed on and extends above each of the plurality of signal pads. A first laterally extending conductive member is spaced from the substrate surface and is attached to the first conductive build-up. The first conductive build-up has a free end and a second conductive build-up is formed on and extends above the first laterally extending member free end. A second laterally extending conducting member is attached to the second conductive build-up and is spaced from and overlies the first laterally extending member, also having a free end. A conductive contact is formed having an accessible contact end that extends upwardly from and is attached to the second laterally extending conductive member free end. Resilient encapsulation means is placed in contact with the substrate surface and surrounds the first and second conductive build-ups and the first and second laterally extending conductive members.

An interconnect between a semiconductor device tester and a plurality of semiconductor devices on a semiconductor wafer includes a substrate and a plurality of signal traces on the substrate for communication with the semiconductor device tester. A plurality of signal pads is formed on the substrate in communication with ones of the plurality of signal traces. A plurality of contacts extends from and is in signal communication with ones of the plurality of signal pads. A stress relief portion is formed on each of the plurality of contacts. An accessible contact end is formed on the plurality of contacts. Resilient means is utilized to encapsulate and support the plurality of contacts.

A stress relieved signal conducting contact is used for positioning in electrical contact with pads, in communication with a semiconductor device. The stress relieved contact includes a contact proximal end for contacting the semiconductor device pads. The contact also includes a contact distal end and a resilient portion disposed between the contact proximate and distal ends. An elastomeric encapsulant is placed to encompass the contact distal end and the resilient portion of the contact.

A stress relieved interconnect assembly is provided for simultaneously contacting access pads on a plurality of semiconductor devices and for transmitting signals therethrough. The interconnect assembly includes a substrate and a plurality of accessible signal traces on the substrate. Further, the assembly includes a plurality of signal pads on the substrate in communication with ones of the plurality of accessible signal traces. A plurality of contacts extend from and are in signal communication with ones of the plurality of signal pads. A stress relief portion is included on each of said plurality of contacts. An accessible contact end is on each of the plurality of contacts and resilient means is used to encapsulate and support the plurality of contacts.

A stress relieved signal conducting contact is carried on a substrate for positioning in electrical contact with signal pads that are in turn in communication with an electronic component. The signal conducting contact includes a free contact end for contacting the electronic component and an opposing contact end fixed to the substrate. A resilient laterally extending signal conducting portion is connected to and extends between the free contact and the opposing contact end.

The invention further relates to a method for producing a large array test probe for simultaneous contact with a large array of semiconductor devices on a semiconductor wafer using a substrate with a plurality of pads and traces that operate to interconnect the probe contacts and a semiconductor tester. The method includes the steps of depositing a first conductive seed layer on the substrate and applying a first series of photoresist coating, masking to expose a first area over the substrate pads, exposure and wash removal of the exposed photoresist. A first layer of conductive material is plated on the first area over the exposed pads. A second conductive seed layer is deposited on the remaining first series photoresist coating and first layer of conductive material. A second series of photoresist coating, masking to expose a second area overlying the first layer of conductive material and extending laterally therefrom, exposure and wash removal of the photoresist is performed. A second layer of conducting material is plated on the second area, whereby the second layer of conducting material has one end attached to the first layer and an opposing free end. A third conductive seed layer is deposited on the remaining second series photoresist coating and the second layer of conductive material and a third series of photoresist coating, masking to expose a third area overlying the second layer free end, and exposure and wash removal of the photoresist is performed. A third layer of conductive material is plated on the third area, whereby the third area of conductive material is attached to the second layer free end. A fourth conductive seed layer is deposited on the remaining third series photoresist coating and the third layer of conductive material. A fourth series of photoresist coating, masking to expose a fourth area overlying the third layer and extending laterally therefrom, exposure and wash removal of the photoresist is performed. A fourth layer of conductive material is plated on the fourth area, whereby the fourth layer of conductive material has one end attached to the third layer and an opposing free end. A fifth conductive seed layer is deposited on the remaining fourth series photoresist coating and the fourth layer of conductive material. A fifth series of photoresist coating, masking to expose a fifth area overlying the fourth area free end, exposure and wash removal of photoresist is applied. A fifth layer of conductive material is plated on the fifth area, whereby the fifth layer of conductive material is attached to the fourth layer free end and provides a contact for ones of the large array of semiconductor devices. The photoresist coating applied in the first through the fifth series is stripped away, whereby the second through the fifth conductive seed layers on the respective photoresist coatings are removed. The exposed first conductive seed layer is then etched away from the substrate and the plurality of pads in the first through the fourth layers of conductive material are encapsulated with a resilient encapsulant.

Further, the method relates to a method of producing a stress relieving signal conducting contact for contacting a signal pad on a semiconductor device. The method includes the utilization of a substrate having a plurality of signal pads and signal traces in communication with the signal pads. Preparation steps for conductive material deposition such as photoresist coating, masking, exposing and washing away of exposed photoresist are performed before each step of plating the conductive material. The method includes the steps of depositing a first thin conductive seed layer on the substrate and thereafter plating a first layer of conductive layer build-up on ones of the signal pads. The method further includes depositing a second thin conductive seed layer over the first layer of conductive material and plating a second layer of conductive material in contact with and extending laterally from the first layer of conductive material. Thereafter, a third thin conductive seed layer is deposited over the second layer of conductive material and a third layer of conductive material is plated in contact with and on the extended end of the second layer of conductive material. A fourth thin conductive seed layer is deposited over the third layer of conducting material and a fourth layer of conductive material is plated to lie in contact with and extend laterally from the third layer of conductive material. Additionally, the method includes the step of depositing a fifth thin conductive seed layer over the fourth layer of conductive material and plating a fifth layer of conductive material in contact with and on the extended end of the fourth layer of conductive material. The exposed first through fifth thin conductive seed layers and residual preparation step materials are removed.

BRIEF DESCRIPTION OF THE DRAWINGS

FIG. 1A is a block diagram of one aspect of the present invention.

FIG. 1B is a block diagram of another aspect of the present invention.

FIG. 2 is a section through one embodiment of the present invention.

FIG. 3 is a section through the embodiment of the invention shown in FIG. 2 at a later stage in the formation thereof FIG. 4A is a diagram of one of the masks used in one embodiment of the present invention.

FIG. 4B is a diagram of an additional mask used in one embodiment of the present invention.

FIG. 4C is a diagram of another mask used in the aforementioned embodiment of the present invention.

FIG. 4D is yet another mask used in the aforementioned embodiment of the present invention.

BACKGROUND OF THE INVENTION

Figure 5:
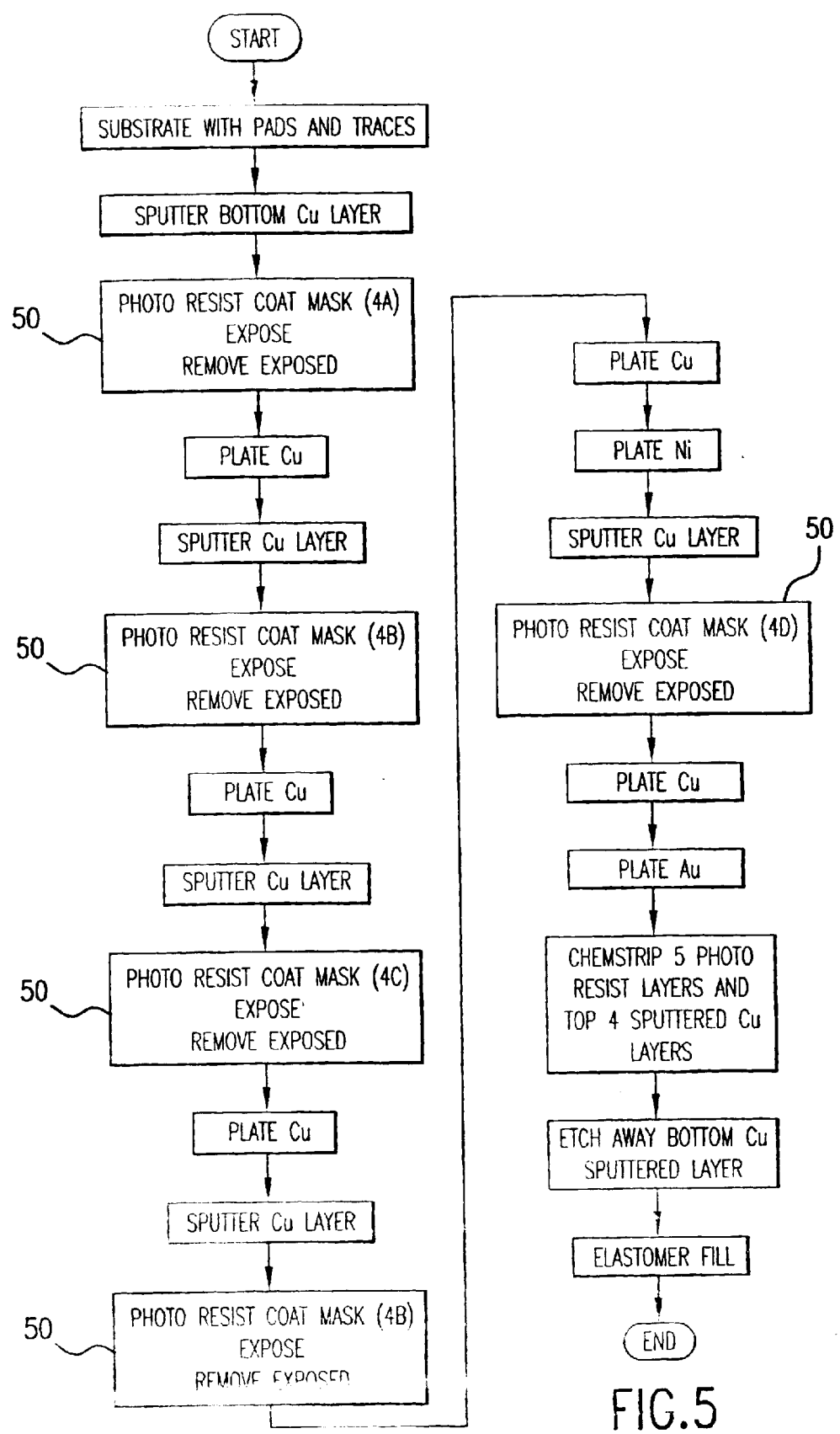
FIG. 5 is a list of process steps used in one embodiment of the present invention.

Electrical testing of unpackaged semiconductor device arrays requires the use of probe contacts that contact the interconnection pads on the semiconductors and convey electrical signals to and from a tester electronic interface. These probe contacts are critical in both dimension and shape so that they will provide mechanical compliance and good electrical signal integrity. These same problems frequently appear when an interface is provided for contact with a semiconductor array functioning in concert with a circuit module. Many known technologies for providing probe contacts or interface contacts are only capable of accessing a single semiconductor device or IC component at a time. Electrical signal performance is generally compromised when long signal paths are present in an IC array device testing and circuit module interconnect. A new contact for test probes or circuit interconnect using fine feature micro-lithographic processes and providing spring characteristics in the contacts is desirable. The signal degradation resulting from long signal paths is avoided as short signal paths are obtained using a unique combination of standard semiconductor fabrication operations.

DESCRIPTION OF THE PREFERRED EMBODIMENTS

The invention disclosed herein is equally useful as an interconnect between a large array of semiconductor devices 11 that provides a circuit function as seen in FIG. 1A, and a large array of unpackaged semiconductor devices formed on a wafer 12 that need to be tested as seen in FIG. 1B. In FIG. 1A a plurality of contacts 13 on an interconnect assembly 14 are shown in signal contact with the integrated circuit array 11. The signals from the array 11 are delivered through the interconnect to a circuit module 16 so that the functions of the assembly of FIG. 1A are performed. In like fashion, the contacts 13 of FIG. 1B are in signal contact with the unpackaged semiconductors in the array 12 on a silicon wafer and provided through a test probe assembly carrying the contacts 13 to a semiconductor tester 18. Turning to FIG. 2 of the drawings, a substrate 19 is shown in section in the depiction. A contact pad 21 is shown, representing one of a plurality of such pads, on the substrate as well as a signal trace 22, representing one of a plurality of such traces, that extends along the surface of the substrate 19 to a point that is accessible to the tester 18 and/or the circuit module 16 of FIGS. 1B and 1A, respectively. A first thin seed layer 23 is sputtered onto the surface of the substrate 19 to overlie the pads 21 and the traces 22.

The first thin seed layer 23 is in the region of 500 angstroms thick. A layer of photoresist 24 is placed on top of the thin seed layer 23 and a mask 26 (FIG. 4A) is properly positioned so that the area within the mask shown in FIG. 4A is exposed in the photoresist layer 24. Exposure of the area within the mask 26 and subsequent removal of the exposed photoresist by known photoresist wash techniques provide a void in the photoresist layer 24 represented by the wall 27. The void 27 is filled by plating a conductive material therein, such as copper, aluminum, etc., until a build-up 28 of the conductive material occupies the void.

A second thin conductive seed layer 29 is placed on top of the remaining photoresist layer 24 and the plated build-up 28, again to a thickness of approximately 500 angstroms. The thin seed layers may be sputtered copper or any other conductive material conveniently placed as indicated in FIG. 2. A second layer of photoresist 31 is placed on top of the seed layer 29 and a mask 32 (FIG. 4B) is positioned with one end above the plated build-up 28 to overlie the photoresist layer 31, exposed and washed to remove a portion of the photoresist layer 31. The removed volume of photoresist is represented by the wall 33 in FIG. 2. The removed volume or void in the photoresist layer 31 is filled as by plating of a conductive material (i.e., copper) to form a laterally extending conductive member 34 having an extended or free end and a shape in plan view substantially as outlined by the mask 32. A third thin seed layer 36 is deposited, as by sputtering, on top of the remaining photoresist layer 31 and the laterally extending plated conductive member 34. A third photoresist layer 37 is laid down on top of the third thin seed layer 36. The third photoresist layer 37 is exposed through a mask as seen at 40 in FIG. 4C that is positioned over the free end of conductive member 34, the photoresist layer 37 is exposed, and the layer is washed to provide a void in the layer 37 represented by the wall 38 in FIG. 2. The void is filled as by plating a conductive material therein to form a conductive connecting member 39 at the extended or free end of conductive member 34.

A fourth thin seed layer 41 is deposited on top of the remaining photoresist in layer 37 and the deposited conducting material of connecting member 39. A fourth photoresist layer 42 is deposited on top of the thin seed layer 41 and is exposed through the mask 32 shown in FIG. 4B, wherein one end of the mask is positioned above the connecting member 39. Photoresist layer 42 is exposed through the mask, washed and the exposed photoresist material of the layer 42 is removed to form a void in the photoresist layer as depicted by the wall 43 in FIG. 2. The void shown by the wall 43 is filled as by plating a conductive material therein to thereby form a laterally extending conductive member 44 that is electrically connected to connecting member 32 at one end, has an extended or free end and substantially overlies the laterally extending conductive member 34. A layer of conducting material 46 is plated on top of the laterally extending conductive member 44, wherein the layer 46 has spring characteristics that improve or enhance the spring characteristics of the laterally extending member 44. A material such as nickel is used in plating the layer 46 on top of the conductive member 44.

A fifth thin seed layer 47 is laid on top of the remaining material in the photoresist layer 42 and the member 44 with the spring enhancing layer 46 on the top thereof. A fifth photoresist layer 48 is put down on top of the fifth seed layer 47 and is exposed through a mask 49 as seen in FIG. 4D, wherein the mask is positioned above the extended end of conductive member 44. The photoresist layer 48 is exposed through the mask 49 to form a void in the photoresist layer as represented by the wall 51 in FIG. 2. A conductive material is plated into the void 51 to form a lower portion of a contact 52. In the interests of obtaining a low electrical noise contact, a low noise contact material, such as gold, is laid on top of the lower portion 52 of the contact to form an upper portion 53 of the contact. At this point, a photoresist wash is used to remove the five photoresist layers 24, 31, 37, 42 and 48, whereupon the upper four thin conductive seed layers 29, 36, 41 and 47 are unsupported and are washed away also. Now the first thin seed layer of conductive material 23 is removed as by etching from the surface of the substrate 19.

As a result of the construction described in conjunction with FIG. 2, the contact shown generally at 54 in FIG. 3 is formed on each of the plurality of pads 21. Since the aforementioned five seed layers are of conductive material as well as the build-up 28, laterally extending conductive member 34, connecting member 39, laterally extending member 44, spring enhancing layer 46, lower contact portion 52 and low noise contact portion 53, the contact 54 provides for signal transmission from the substrate 19 through the contact low noise tip 53. The contact 54 may be seen to provide a spring function when force is applied to displace the low noise tip 53 and the "U" section formed by the laterally extending member 44, the connecting member 39 and the laterally extending member 34. These members flex to allow the low noise contact tip to be displaced through a predetermined distance by a force and then to return to its original position when the force is removed. Additionally, resilient means is utilized to encapsulate and support the contacts when a plurality or an array of contacts 54 is present in the assembly. FIG. 3 also shows an encapsulant 56 that is elastomeric and dielectric in nature and surrounds the portions 28, 34, 39 and 44/46 of the contact 54. The encapsulant is further in contact with the surface of the substrate 19. In this fashion, the contact 54 is supported in the elastomeric encapsulant 56 so that the small dimensions of the contact 54 are protected from inadvertent rough handling and damage. The encapsulant may be a silicone elastomer. The entire height of the contact 54 from the top of the substrate 19 in FIG. 3 to the top of the spring enhancing layer 46 is approximately 200 to 250 microns. It has been found that the relative heights of the layers 28, 34, 39 and 44/46 are approximately 1/5, 1/5, 2/5 and 1/5 of the height of the contact 54 from the substrate 19 surface to the top of the spring enhancing layer 46. The thin seed layers 23, 29, 36 and 41 are relatively small, but are included in the foregoing proportions recited for conductive material layers 28, 34, 39 and 44/46, respectively. It may be seen that the contact 54 as disclosed provides stress relief as dimensional changes in the contact or adjacent materials are caused by changes in temperature, for example.

FIG. 5 is a serially arranged process step list that illustrates a method to be used to fabricate the contact 54 and the entire assembly shown in section in FIG. 3. Starting with a substrate having pads and traces thereon as previously described, a bottom copper layer 23 is sputtered onto the substrate. A photoresist coat 24 is laid on top of the sputtered layer 23, mask 26 in FIG. 4A is applied to the photoresist coat 24, the photoresist is exposed and the exposed photoresist is removed. The resulting cavity or void represented by the wall 27 is filled by plating copper therein, as seen by the copper or conductive material build-up 28 in the Figures. Thin seed layer 29 is sputtered on top of the remaining photoresist layer 24 and the copper plated build-up 28. Photoresist layer 31 is laid on top of the thin seed layer 29 and mask 32 of FIG. 4B is positioned as described. Photoresist layer 31 is exposed and the exposed photoresist is removed, forming the void in photoresist layer 31 represented by wall 33. Copper is plated in the void in photoresist layer 31 to form the laterally extending member 34 and third thin seed layer 36 is sputtered on top of the conductive member 34 and the remaining portions of photoresist layer 31. Photoresist layer 37 is laid on top of the third thin seed layer 36 and masked with the mask 40 seen in FIG. 4C. The photoresist layer 37 is exposed through the mask 40 and the exposed photoresist removed to form the void in the photoresist layer 37 represented by the wall 38. The void is filled as by plating a conductive material to form conductive connecting member 39. A fourth thin seed layer 41 is laid on top of the remaining portions of photoresist layer 37 and connecting member 39. A fourth photoresist layer 42 is laid on top of the fourth thin seed layer 41. Photoresist layer 42 is exposed through mask 32 seen in FIG. 4B and exposed portions of photoresist layer 42 are washed away to form a void in the photoresist layer as evidenced by the wall 43. Copper is plated into the void 33 to form the laterally extending member 44 and a nickel layer 46 is plated on top of the laterally extending member 44 to provide enhanced spring characteristics therein. A fifth thin seed layer 47 is laid on top of the remaining portions of photoresist layer 42 and the nickel layer 46. Photoresist layer 48 is laid down on top of the thin seed layer 47. Mask 49, as seen in FIG. 4D, is positioned on top of the photoresist layer 48, as previously described, and a portion of the photoresist layer 48 is exposed through the mask. The exposed portion of photoresist layer 48 is washed away to form a void therein as evidenced by the wall 51. Copper is plated within the void surrounded by the wall 51 to form the lower portion of the probe contact 52. The low electrical noise material, such as gold, is plated on top of the lower contact portion 52 to provide a low noise contact tip 53 on the free end of the contact 54. The five photoresist layers and the top four sputtered copper layers are removed by chemical stripping and the bottom thin seed layer 23 is removed from the surface of the substrate 19 by etching the material away. The entire assembly is encapsulated in an elastomer leaving the free end at the low electrical noise tip 53 of the contact accessible, and the formation of the stress relieved contact 54 is complete.

In the preferred embodiment disclosed herein it should be noted that each of the steps of plating a conductive material to form a conductive portion of the contact 54 is preceded by a preparatory combination of steps 50 as shown in FIG. 5. The combination 50 includes the steps of photoresist coating, masking the photoresist coating, exposing the photoresist coating through the mask and removing the exposed photoresist coating with an appropriate wash.

It should also be noted that as used herein the term "test" refers to tests for both the functionality of a device or die in an array as well as for the ability of the device to withstand power conditioning or "burn-in". These tests must display characteristics in accordance with the governing device specifications in both instances. The functionality tests provide assurance that the device will operate in the specified manner and the power conditioning tests assure that the device will prove reliable for at least the specified life. The former tests are performed over a relatively short period while the latter tests are performed over a relatively long period.

Although the best mode contemplated for carrying out the present invention has been shown and described herein, it will be understood that modification and variation may be made without departing from what is regarded to be the subject matter of the invention.

What is claimed:

1. An interconnect between a semiconductor device tester and a plurality of semiconductor devices on a semiconductor wafer, comprising
   a substrate,
   a plurality of signal traces on said substrate for communication with the semiconductor device tester,
   a plurality of signal pads on said substrate in communication with ones of said plurality of signal traces,
   a plurality of contacts extending from and in signal communication with ones of said plurality of signal pads,
   a stress relief portion on said plurality of contacts,
   an accessible contact end on said plurality of contacts, and
   resilient means for encapsulating and supporting said plurality of contacts,
   wherein said stress relief portion comprises
   a laterally extending U-shaped member spaced from said substrate.

2. The interconnect of claim 1, wherein said laterally extending U-shaped member comprises,
   a lower conductor member in electrical contact with ones of said plurality of signal pads at one end,
   a cross connecting conductor member at an opposing end of said lower conductor, and
   an upper conductor member in electrical contact with said cross connecting conductor member positioned to overlie said lower conductor member.

3. The interconnect of claim 2, wherein said upper conductor member further comprises
   means for enhancing the spring characteristics of said upper conductor member.

4. The interconnect of claim 1, wherein said resilient means for encapsulating comprises
   a silicone encapsulant.

5. The interconnect of claim 1, wherein said accessible contact end comprises
   a gold contact tip.

6. A stress relieved interconnect assembly for simultaneously contacting access pads on a plurality of semiconductor devices and for transmitting signals therethrough, comprising
   a substrate,
   a plurality of accessible signal traces on said substrate,
   a plurality of signal pads on said substrate in communication with ones of said plurality of accessible signal traces,
   a plurality of contacts extending from and in signal communication with ones of said plurality of signal pads,
   a stress relief portion on said plurality of contacts,
   an accessible contact end on said plurality of contacts, and
   resilient means for encapsulating and supporting said plurality of contacts,
   wherein said stress relief portion comprises
   a laterally extending U-shaped member spaced from said substrate.

7. The interconnect assembly of claim 6, wherein said laterally extending U-shaped member comprises
   a lower conductor member in electrical contact with ones of said signal pads at one end,
   a cross connecting member at an opposing end of said lower conductor member, and
   an upper conductor member in electrical contact with said cross connecting member positioned to overlie said lower conductor member.

8. The interconnect assembly of claim 7, wherein said upper conductor member further comprises
   means for enhancing spring characteristics of said upper conductor member.

9. The interconnect assembly of claim 6, wherein said resilient means for encapsulating comprises
   a silicone encapsulant.

10. The interconnect assembly of claim 6, wherein said accessible contact end comprises
    a gold contact tip.

* * * * *